United States Patent [19]
Murtojarvi

[11] Patent Number: 5,469,126
[45] Date of Patent: Nov. 21, 1995

[54] I/Q-MODULATOR AND I/Q-DEMODULATOR

[75] Inventor: Simo Murtojarvi, Salo, Finland

[73] Assignee: Nokia Mobile Phones Ltd., Salo, Finland

[21] Appl. No.: 301,614

[22] Filed: Sep. 7, 1994

[30] Foreign Application Priority Data

Sep. 11, 1993 [GB] United Kingdom ............... 9318860

[51] Int. Cl.$^6$ ............................ H04L 27/36; H04L 27/38
[52] U.S. Cl. .......................... 332/105; 329/305; 329/306;
329/348; 329/358; 329/366; 332/152; 332/172;
332/178; 375/261; 455/102
[58] Field of Search ..................... 332/103, 105,
332/119, 146, 152, 172, 177, 178; 455/102;
375/39; 329/304, 305, 306, 316, 346, 348,
358, 366

[56] References Cited

U.S. PATENT DOCUMENTS

| | | | |
|---|---|---|---|
| 4,367,560 | 1/1983 | Hallford | 455/330 |
| 5,006,811 | 4/1991 | Kruger | 329/354 |
| 5,153,536 | 10/1992 | Muller | 332/105 |
| 5,214,397 | 5/1993 | Muller | 332/105 |
| 5,231,364 | 7/1993 | Mucke | 332/105 |
| 5,311,151 | 5/1994 | Väisänen | 332/105 |
| 5,357,221 | 10/1994 | Matero | 332/123 |
| 5,371,481 | 12/1994 | Tiittanen et al. | 332/103 |
| 5,392,460 | 2/1995 | Mattila et al. | 455/76 |

FOREIGN PATENT DOCUMENTS 2219704 12/1989 Finland .

OTHER PUBLICATIONS

D. Neuf et al., "Conventional and New Applications For the Quadrature IF Microwave Mixer", 176 Microwave Journal, vol. 26 (1983), Jan. No. 1, pp. 99, 100, 102, 103 and 109.
A. Pavio et al., "Broadband Monolithic Single and Double Ring Active/Passive Mixers", IEEE 1988 Microwave and Millimeter-Wave Monolithic Circuits Symposium, pp. 71–74.
Patent Abstract of Japan, No. JP63209207, Pub. Date Aug. 30, 1988, Kashiwagi Michio.

Primary Examiner—Siegfried H. Grimm
Attorney, Agent, or Firm—Perman & Green

[57] ABSTRACT

An I/Q-modulator or I/Q demodulator circuit in which the modulating signals (2, 3) are input through the output phase transfer branches of the circuit. In relation to the RF-characteristics, a series resistor (16) and a series inductance (20) in the phase transfer circuits are grounded with small capacitors (23, 25). A capacitor (17) having a high impedance at the modulating frequency is located between the branches. Tho modulating signals are not summed through the capacitor (17), and, thus, their phase difference is not weakened.

16 Claims, 1 Drawing Sheet

I/Q-MODULATOR AND I/Q-DEMODULATOR

BACKGROUND OF THE INVENTION

This invention relates to an I/Q modulator or I/Q demodulator circuit.

The prior art is described below with reference to FIG. 1.

FIG. 1 is a circuit diagram of a generally used circuit for an I/Q-modulator or I/Q-demodulator. The circuit comprises an RF-transformer 1 and a diode bridge formed by four diodes 4, 5, 6, 7, and two low pass filters formed by a pair of capacitors 8, 9 and 11, 12, respectively, and by a resistor 10 and 13, respectively.

The input signals 2 and 3 are lead through the low pass filters to the diode bridge formed by the four diodes 4–7. The local oscillator (LO) signal is lead to the diode bridge through the RF transformer 1. The mixed signals are lead to capacitors 14, 15 and then to a capacitor 17 and a resistor 18. A resistor 16, a capacitor 19 and a coil 20 are connected to ground. A combined MOD OUT -signal is taken as an output signal through a capacitor 21.

The modulating signal is lead to the modulator as a separate branch as shown in FIG. 1. In the modulator according to FIG. 1, however, the diodes have to be close to the RF-transformer and clog to each other. The layout becomes difficult, since the diodes have to receive signals from two branches.

Also chokes should be used in the place of resistors 10, 13 so that the modulating signal branch would not load the output at the output frequency.

SUMMARY OF THE INVENTION

According to the present invention there is provided an I/Q-modulator or I/Q-demodulator comprising capacitors so coupled that the modulating signals can be provided through a pair of output phase shift branches of the circuit, from which the output signal is obtained, without the modulating signals loading the output at the output frequency.

BRIEF DESCRIPTION OF THE DRAWINGS

An embodiment of the present invention will now be described with reference to the accompanying drawing, wherein.

DETAILED DESCRIPTION OF THE INVENTION

Figure 1:
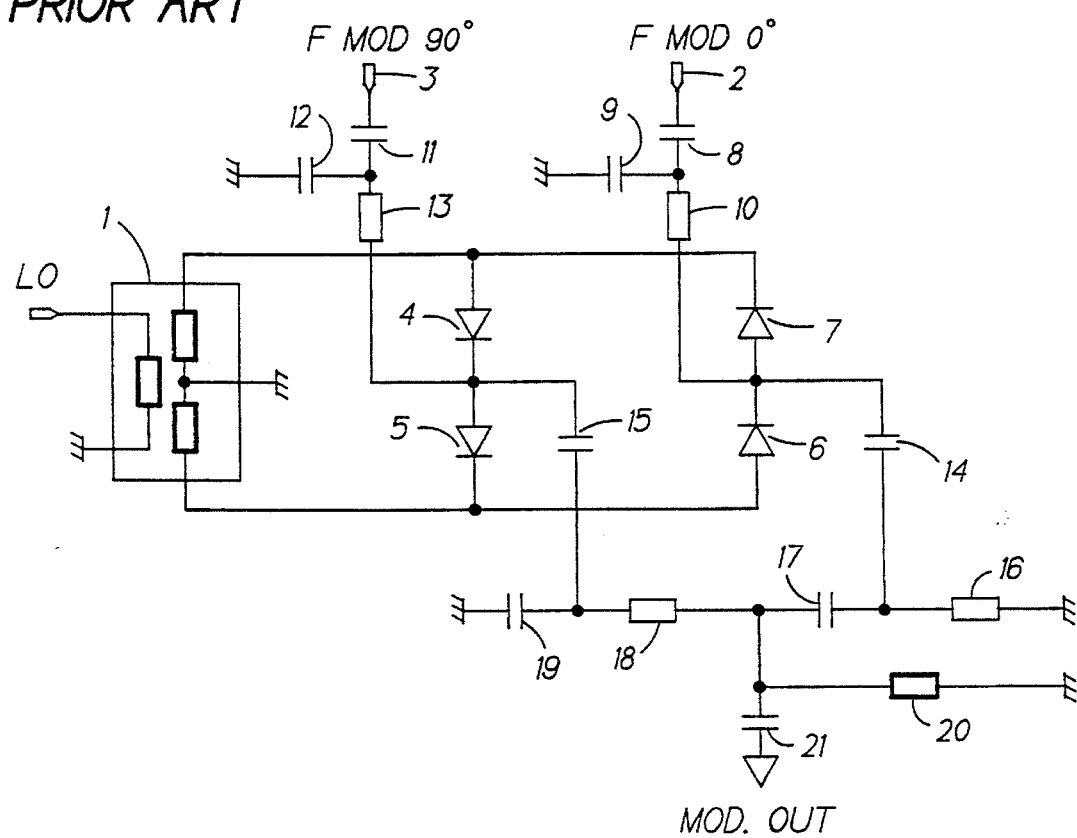
FIG. 1 is a circuit diagram of a conventional modulator/demodulator.
Figure 2:
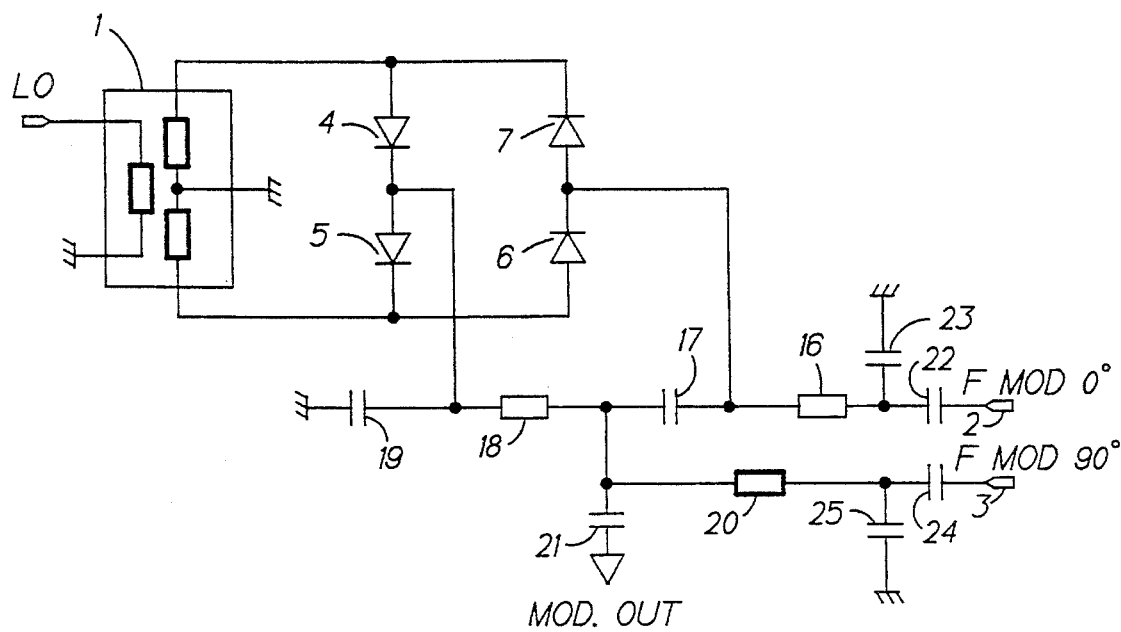
FIG. 2 which is a circuit diagram of an I/Q modulator/demodulator in accordance with the present invention.

In the circuit illustrated in FIG. 2 the modulating signals 2, 3 are input through the output phase shift branches of the circuit. The modulating 0 DEG -signal 2 is lead through capacitor 22 and resistor 16 and the modulating 90 DBG-signal 3 is lead through capacitor 24, inductor 20 and resistor 18.

In relation to the RF-characteristics, the resistor 16 of the R/C-phase, shift circuit is grounded with a small capacitor 23, which has a great impedance for the modulating signal 2. The modulating signal can be lead to diodes 6, 7.

The inductance 20 used to eliminate the capacitive reactance of the phase shift circuit is grounded, in relation to the RF-characteristics, with a capacitor 25 which has a great impedance for the modulating signal 3. The modulating signal can be lead to diodes 4, 5.

The capacitor 17 between the phase shift branches is dimensioned so that it has a high impedance at the modulating frequency. The modulating signals are not summed through the capacitor 17, and their phase difference is not weakened.

With the help of the invention the layout of the diode modulator is simplified and the characteristics of the diode modulator are improved, especially if the signals are coupled to the modulator only resistively.

The supply of the modulating signal through a phase shift circuit in accordance with the invention can be realized as well with other forms of phase shift circuits, for example with an L/C-quadrature hybrid circuit.

The capacitors 2.2, 24 can also be replaced with short-circuits enabling DC connection of the modulating signals. Also the secondary of the RF-transformer 1 can be RF-grounded with a capacitor enabling DC-biasing of the circuitry.

In view of the foregoing it will be clear to a person skilled in the an that modifications may be incorporated without departing from the scope of the present invention.

What is claimed is:

1. A circuit arrangement, comprising:
   a diode bridge having first and second terminals coupled to a first frequency signal and third and fourth terminals coupled to a first node of a first phase shift network and to a first node of a second phase shift network, respectively;
   said first phase shift network having a second node for passing therethrough a second frequency signal, said second node being coupled to ground potential through a first capacitance having a value that represents a high impedance to said second frequency signal;
   said second phase shift network having a second node for passing therethrough a third frequency signal, said second node of said second phase shift network being coupled to ground potential through a second capacitance having a value that represents a high impedance to said third frequency signal; and
   a third capacitance coupled between said first node of said first phase shift network and said first node of said second phase shift network, said third capacitance having a value that represents a high impedance to said second frequency signal and to said third frequency signal.

2. A circuit arrangement as set forth in claim 1 wherein said first frequency signal is a local oscillator signal, wherein said second frequency signal is a first modulating signal, wherein said third frequency signal is a second modulating signal that has a predetermined phase relationship to said first modulating signal, and further comprising an output terminal that is capacitively coupled to said first node of said first phase shift network and said first node of said second phase shift network.

3. A circuit arrangement as set forth in claim 1 wherein said first frequency signal is coupled to said first and second terminals through a secondary of a transformer.

4. A circuit arrangement as set forth in claim 3 wherein said secondary has a center tap that is directly coupled to ground potential.

5. A circuit arrangement as set forth in claim 3 wherein said secondary has a center tap that is capacitively coupled to ground potential.

6. A circuit arrangement as set forth in claim 1 wherein said first phase shift network is comprised of a resistance having a first terminal that is coupled to said third terminal of said diode bridge and a second terminal that is coupled to a first terminal of said first capacitance and to said second frequency signal, wherein a second terminal of said first capacitance is coupled to ground potential.

7. A circuit arrangement as set forth in claim 6 wherein said second terminal of said resistance is coupled to said second frequency signal through a series connected coupling capacitance.

8. A circuit arrangement as set forth in claim 1 wherein said second phase shift network is comprised of an inductance having a first terminal that is coupled to said fourth terminal of said diode bridge and a second terminal that is coupled to a first terminal of said second capacitance and to said third frequency signal, wherein a second terminal of said second capacitance is coupled to ground potential.

9. A circuit arrangement as set forth in claim 8 wherein said second terminal of said inductance is coupled to said third frequency signal through a series connected coupling capacitance.

10. An I/Q modulator, comprising:

an RF transformer comprising a primary coupled to a local oscillator (LO) frequency signal and a secondary;

a diode bridge having first and second terminals coupled across said secondary and third and fourth terminals coupled to a first node of a first phase shift network and to a first node of a second phase shift network, respectively;

said first phase shift network having a second node coupled to a first modulating frequency signal, said second node being coupled to ground potential through a first capacitance having a value that represents a high impedance to said first modulating frequency signal;

said second phase shift network having a second node coupled to a second modulating frequency signal that has a 90° phase relationship to said first modulating signal, said second node of said second phase shift network being coupled to ground potential through a second capacitance having a value that represents a high impedance to said second modulating frequency signal;

a third capacitance coupled between said first node of said first phase shift network and said first node of said second phase shift network, said third capacitance having a value that represents a high impedance to said first modulating frequency signal and to said second modulating frequency signal; and an output terminal that is capacitively coupled to said first node of said first phase shift network and said first node of said second phase shift network.

11. An I/Q modulator as set forth in claim 10, wherein said secondary has a tap that is directly coupled to ground potential.

12. An I/Q modulator as set forth in claim 10, wherein said secondary has a tap that is capacitively coupled to ground potential.

13. An I/Q modulator as set forth in claim 10 wherein said first phase shift network is comprised of a resistance having a first terminal that is coupled to said third terminal of said diode bridge and a second terminal that is coupled to a first terminal of said first capacitance and to said first modulating frequency signal, wherein a second terminal of said first capacitance is coupled to ground potential.

14. An I/Q modulator as set forth in claim 13, wherein said second terminal of said resistance is coupled to said first modulating frequency signal through a series connected coupling capacitance.

15. An I/Q modulator as set forth in claim 10, wherein said second phase shift network is comprised of an inductance having a first terminal that is coupled to said fourth terminal of said diode bridge and a second terminal that is coupled to a first terminal of said second capacitance and to said second modulating frequency signal, wherein a second terminal of said second capacitance is coupled to ground potential.

16. An I/Q modulator as set forth in claim 15 wherein said second terminal of said inductance is coupled to said second modulating frequency signal through a series connected coupling capacitance.

* * * * *

UNITED STATES PATENT AND TRADEMARK OFFICE
CERTIFICATE OF CORRECTION

PATENT NO. : 5,469,126

DATED : November 21, 1995

INVENTOR(S) : Murtojarvi

It is certified that error appears in the above-identified patent and that said Letters Patent is hereby corrected as shown below:

Col. 2, Claim 2, line 53, "to" should read --between--.

Signed and Sealed this

Twentieth Day of February, 1996

Attest:

BRUCE LEHMAN

Attesting Officer

Commissioner of Patents and Trademarks